United States Patent

Tsuchimoto

[11] 4,123,316
[45] Oct. 31, 1978

[54] PLASMA PROCESSOR

[75] Inventor: Takashi Tsuchimoto, Kodaira, Japan

[73] Assignee: Hitachi, Ltd., Japan

[21] Appl. No.: 729,987

[22] Filed: Oct. 6, 1976

[30] Foreign Application Priority Data

Oct. 6, 1975 [JP] Japan .................................. 50/119769
Feb. 16, 1976 [JP] Japan .................................. 51/14854

[51] Int. Cl.$^2$ .................................................. B01K 1/00
[52] U.S. Cl. ......................................... 156/643; 156/345;
156/646; 156/662; 204/164; 204/192 E;
204/298; 250/531
[58] Field of Search ............ 250/531; 204/164, 192 E,
204/298; 156/643, 646, 662, 345

[56] References Cited
U.S. PATENT DOCUMENTS 3,291,715 12/1966 Anderson .............................. 250/531
3,528,387 9/1970 Hamilton ........................ 204/192 E
3,708,418 1/1973 Quinn .............................. 204/192 E
3,824,398 7/1974 Boom ................................... 204/164

Primary Examiner—Leland A. Sebastian
Assistant Examiner—Deborah L. Kyle
Attorney, Agent, or Firm—Craig & Antonelli

[57] ABSTRACT

A plasma processor comprising a plasma generating chamber which has a plasma outflow port, an evacuated plasma processing chamber which receives therein a member to be processed, such as a semiconductor substrate, and coaxial magnet means to form coaxial magnetic fields for transporting plasma from the plasma outflow port of the plasma generating chamber to the member to be processed, the distance between the plasma outflow port and the member to be processed being made shorter than the mean free path of gas remaining in the plasma processing chamber.

27 Claims, 5 Drawing Figures

PLASMA PROCESSOR

BACKGROUND OF THE INVENTION

1. Field of the Invention

This invention relates to a plasma processor, and more particularly, to a plasma processor for subjecting a semiconductor substrate to an etching or deposition process by means of a plasma stream.

2. Description of the Prior Art

Heretofore, a wet process which uses various solutions and large quantities of wash water has been employed for the etching of a thin film, such as a silicon dioxide ($SiO_2$) film, a silicon nitride ($Si_3N_4$) film, a polycrystalline silicon film, and an aluminum film, formed on a semiconductor substrate, or for the removal of a photoresist film formed thereon.

The process has involved many problems from the point of view of the use of large quantities of various chemicals, the safety of the operations, the technique and economy of foul solution disposal, the simplification and automation of the water processing stages of the work, etc. On the other hand, a dry process which exploits a gas plasma has recently come to be employed as a method for solving the above-mentioned problems of the wet process.

As a processor for semiconductor substrates which utilizes a plasma, there is generally used a structure such as shown in FIG. 1. In the illustrated apparatus, while a raw material gas for an intended processing, for example, freon or oxygen is being introduced into a quartz tube 1 through a gas introducing pipe 2 and is being exhausted through an exhaust pipe 3, the intra-tubular pressure is held at a value suitable for creating a discharge and for processing the substrate, for example, 0.5 – 2 Torr. By means of an oscillator 4 and a high frequency coil 5, a non-polar high frequency discharge is induced within the quartz tube 1 so as to generate the intended plasma 6 therein. The semiconductor substrates 8 to be processed are inserted in the tube 1 in advance in the state under which they are to be processed and they are supported therein on a holder 7. In this way, a selected operation on the substrates can be performed, for example, the removal of a photoresist film, or the etching of a silicon compound film, a polycrystalline silicon film, or an aluminum film.

It has been found, however, that the conventional plasma processor has the following disadvantages:

(1) Since the semiconductor substrate is placed in a high frequency electric field, it undergoes a temperature rise, and the photoresist film applied on the semiconductor substrate for local etching reaches its softening point and begins to flow.

(2) Since the semiconductor substrate is placed in the plasma of the high frequency discharge, electrons in the plasma are accelerated by the high frequency electric field and adversely affect the substrate. For example, the value of the surface resistivity of a silicon substrate increases, or the threshold voltage of a MOS transistor changes.

On the other hand, by utilizing a method of transporting a substance by means of a plasma, as disclosed in the specification of Japanese Patent Application Publication No. 38801/1970, a plasma generated in a plasma generating chamber may be transported onto a semiconductor substrate in a plasma processing chamber, to process a thin film on the substrate (Japanese Patent Application No. 74182/1972). According to this method, the semiconductor substrate need not be placed in the high frequency electric field, and hence, the problems of the heating of the semiconductor substrate ascribable to the high frequency electric field and the damage of the substrate ascribable to the acceleration of electrons in the plasma do not occur.

As a result of many experiments conducted for the performance of this method, however, it has been revealed that where the degree of vacuum in the plasma processing chamber is inferior, the plasma within the processing chamber recombines into neutral atoms, so that the efficiency of the plasma transportation lowers conspicuously. This invention is particularly directed to the solution of such a problem.

SUMMARY OF THE INVENTION

It is accordingly an object of this invention to provide a plasma processor in which a plasma generated in a plasma generating chamber is efficiently transported onto a semiconductor substrate of a member to be processed within a plasma processing chamber, so that the processor is suitable for mass processing in a production process.

Another object of this invention is to provide a plasma processor in which the member to be processed is etching during the plasma processing operation.

Still another object of this invention is to provide a plasma processor in which a substance is deposited on the surface of the member to be processed during the plasma processing operation.

In order to accomplish these objects, this invention provides that the distance between a plasma outflow port of a plasma generating chamber and a member to be processed is to be less than the length of the mean free path of gas remaining in the evacuated plasma processing chamber and that a plasma is transported from the outflow port of said plasma generating chamber to said member to be processed by coaxial magnetic fields.

Another construction of this invention provides for the distance between the plasma outflow port of the plasma generating chamber and the member to be processed to be less than the length of the mean free path of gas remaining in the evacuated plasma processing chamber, with the plasma being transported from the outflow port of said plasma generating chamber to said member to be processed by coaxial magnetic fields, and that said plasma processing chamber is additionally provided with preliminary evacuation chambers so as to permit exchange of said member to be processed in the processing chamber without lowering the degree of vacuum of said processing chamber.

A further construction of this invention consists of a plasma processor as described wherein a part of said member to be processed is subjected to an etching process by a plasma stream.

A still further construction of this invention consists of a plasma processor as described wherein the surface of said member to be processed is subjected to a deposition processing with a substance by a plasma stream.

PREFERRED EMBODIMENTS OF THE INVENTION

Figure 1:
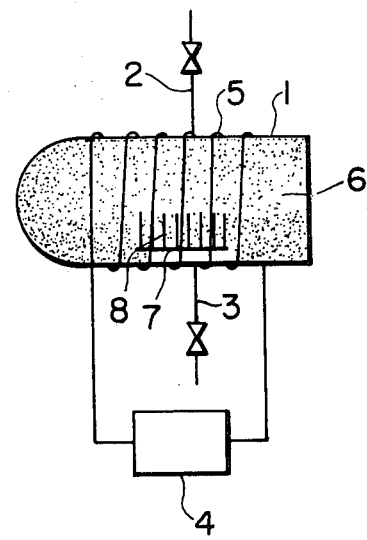
FIG. 1 is a front view schematically showing a prior art plasma processor.
Figure 2:
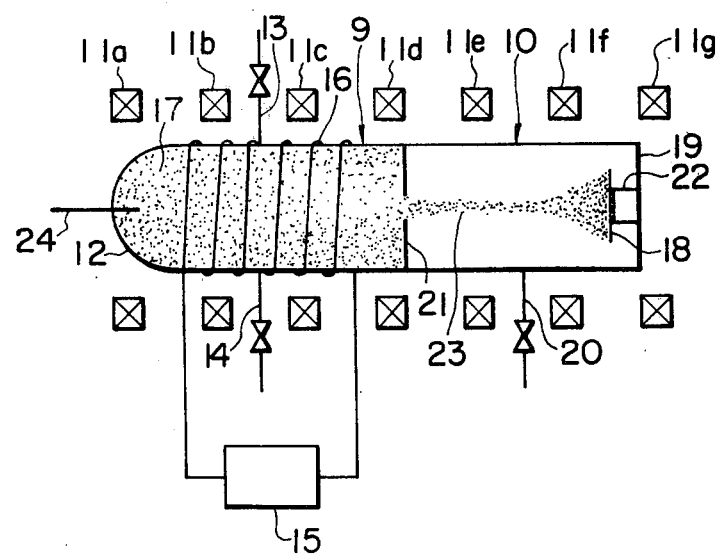
FIG. 2 is a schematic front view of one fundamental form of a plasma processor according to this invention.

FIG. 2 is a front view which schematically shows a plasma processor for a semiconductor substrate according to this invention. The plasma processor comprises a plasma generating chamber 9 on the left, a plasma processing chamber 10 on the right which adjoins the chamber 9, and coaxial electromagnets 11 spaced along the axis of the chambers 9 and 10 in surrounding relationship thereto. The left plasma generating chamber 9 has substantially the same construction as that of the apparatus in FIG. 1. While introducing a raw material gas for an intended process (for example, $CF_4$ gas or $O_2$ gas) into a quartz discharge tube 12 through a gas introducing pipe 13 and exhausting it through an exhaust pipe 14, the pressure in the tube is held at a suitable value for a high frequency discharge, about 0.1 – 1 Torr. By means of a high frequency oscillator 15 connected to a high frequency oscillation coil 16, a nonpolar discharge is induced within the tube 12 so as to generate the intended plasma 17 therein. The plasma processing chamber 10 is a chamber in which the processing of a semiconductor substrate 18 is carried out by the use of a plasma stream flowing out from the plasma generating chamber 9 under a diffusion action. In order to lead the plasma stream from the plasma generating chamber 9 to the semiconductor substrate 18 in the plasma processing chamber 10, a plurality of coaxial electromagnets 11 are situated, for example, as shown in the figure. When coaxial magnetic fields are established by energizing the electromagnets from a d.c. power source (not shown), the plasma produced in the plasma generating chamber flows as a plasma stream through the interior of a so-called "magnetic field pipe", which is formed by the coaxial magnetic fields, and it enters into the plasma processing chamber which has an outer wall constructed of a quartz tube 19.

In order that the plasma stream flowing out into the plasma processing chamber may effectively arrive at the semiconductor substrate for performing the working operation, the plasma processing chamber is maintained at a high vacuum. That is, in order to prevent plasma particles from colliding and recombining into neutral atoms within the plasma processing chamber, the chamber is maintained at a high vacuum. To this end, the pressure in the plasma processing chamber is kept at $10^{-4} - 10^{-5}$ Torr by an exhaust pipe 20 connected to a vacuum pump and a slit diaphragm 21 located between the chambers 9 and 10.

At a part of the plasma processing chamber 10 for processing the semiconductor substrate, the semiconductor substrate 18 is supported on a substrate holder 22. The plasma stream is caused to flow to the substrate, and the intended plasma processing is carried out. It is required that the plasma stream arrive uniformly over the entire area of the semiconductor substrate. To this end, the plasma stream can be uniformly spread on the substrate surface by, for example, weakening the magnetic fields of the coaxial electromagnets 11f and 11g in the vicinity of the semiconductor substrate, and thus increasing the size of the magnetic field pipe in that area. As another example, the plasma current can be spread by causing a current to flow through the electromagnet 11g which is opposite in direction to those currents flowing through the electromagnets 11a – 11f so as to establish a counter magnetic field in the area of electromagnet 11g and to thus cause the resultant magnetic field to diverge suddenly and in a proper amount in the vicinity of the semiconductor substrate.

In order to raise the chemical reaction velocity between the plasma and the semiconductor substrate, the electric potential of the plasma with respect to the semiconductor substrate can be made high. By way of example, the semiconductor substrate 18 may be placed at ground potential, while a probe 24 is inserted into the plasma generating chamber 9 which has a potential (e.g., several V — 10 V or so) applied thereto. Instead of inserting the probe 24 into the chamber, the slit 21 may be made of an electrically conductive substance and have a potential applied thereto. In order to subject the semiconductor substrate to sputtering, rather than to promote the chemical reaction, a potential difference can be established between the semiconductor substrate and the plasma stream. As the potential difference in this case, however, a value of several hundreds to 1,000 V or so is required.

By combining the potential to be applied to the plasma by the probe and the divergence or intensity of the magnetic field, the angle of incidence of ions from within the plasma onto the semiconductor substrate can be adjusted in either case of the chemical reaction or the sputtering operation. This results in adjusting the turning-round movement of the ions under a mask during etching, and is important in the etching technology because it makes it possible to etch the semiconductor substrate orthogonally right beneath an end of the mask, to perform so-called side etching which turns around under the mask or to adjust the extent of the side etching.

Figure 3:
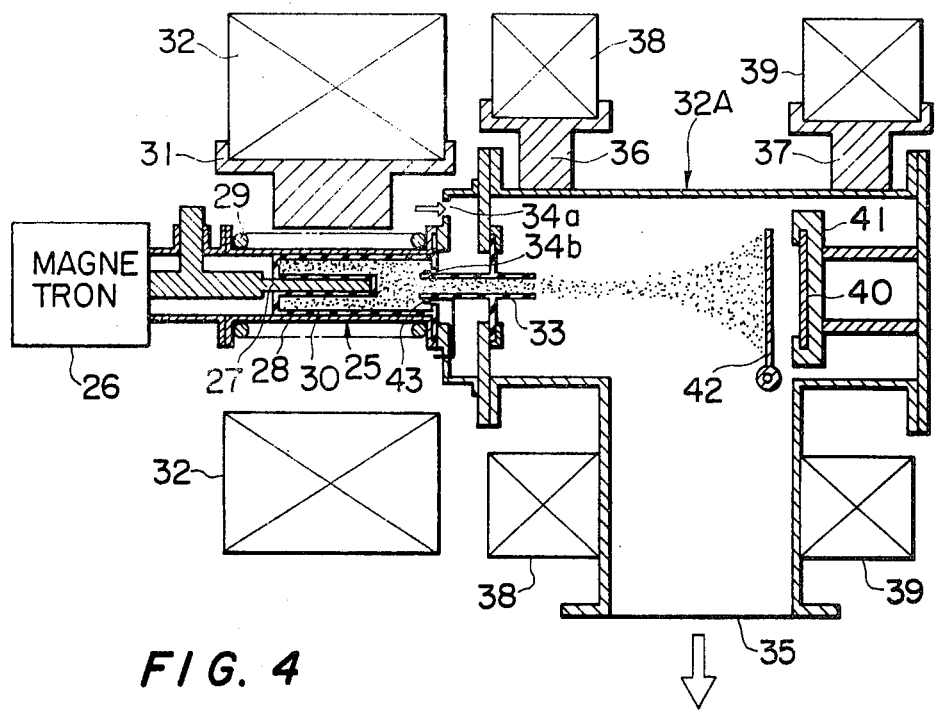
FIG. 3 is a front sectional view showing an embodiment of the plasma processor according to this invention.

FIG. 3 is a front sectional view which specifically illustrates an embodiment of the plasma processor according to this invention for the etching processing of a semiconductor device. In the apparatus, an electromagnetic field of several GHz is impressed between two electrodes 27 and 28 of a waveguide by a magnetron 26, to produce a plasma in a plasma generating chamber 25 under a pressure of $10^{-2} - 10^{-3}$ Torr. In the figure, numeral 29 designates a cooling pipe which surrounds the chamber 25, and numeral 30 is a quartz tube. The quartz tube 30 serves to prevent metals, etc., vaporizing from the inner wall of the plasma generating chamber (waveguide) 25 due to the discharge from being mixed into the plasma, and also serves to keep the discharge portion for the production of the plasma airtight as against atmospheric pressure and hold the introduced discharge gas at a pressure proper for the establishment of the discharge in this case.

An electromagnet 32, which is disposed around the plasma generating chamber 25 and supported by means of a support 31, functions to extend the orbit lengths of electrons which are accelerated by the high frequency electric field established between the two electrodes 27 and 28, and to thus enhance the ionization density of the plasma which occurs therebetween. A plasma processing chamber 32A is formed of a nonmagnetic material, such as stainless steel, the internal pressure thereof is held at $10^{-5} - 10^{-6}$ Torr or so, and the plasma produced in the plasma generating chamber 25 is introduced thereinto through a plasma outflow pipe 33 made of quartz. Symbols 34a and 34b indicate raw material gas-introducing portions, and numeral 35 designates an exhaust pipe. The introduced plasma is transferred onto a semiconductor substrate 40 by a magnetic pipe which is formed by electromagnets 38 and 39 carried on supports 36 and 37 to surround the plasma processing chamber. In this case, the electromagnets are disposed so that the plasma may spread uniformly on the semiconductor substrate. The semiconductor substrate 40 is held in the plasma processing chamber by a holder 41 made of stainless steel or the like, and is subjected to the plasma processing for a desired period of time owning to a pivotable shutter 42 made of molybdenum, nickel, stainless steel or the like, which may be moved into the position shown to intercept the plasma stream when the process is complete.

Since the apparatus generates the plasma at several GHz by utilizing a magnetron, the pressure of the plasma generating chamber can be made $10^{-2} - 10^{-3}$ Torr or so. Accordingly, the pressure of the plasma processing chamber can be comparatively easily held at $10^{-5} - 10^{-6}$ Torr or so. By making the pressure of the generating chamber low, the plasma density can be made high. The density of the plasma stream to be introduced into the processing chamber can be enhanced, and the chemical reaction with the semi-conductor substrate can be promoted.

Also in this apparatus, an electric potential can be bestowed on the plasma by disposing a probe 43 in the chamber, as in the apparatus of FIG. 2.

As the discharge gas which is the raw material of the plasma to be produced in the plasma chamber, oxygen ($O_2$) is used for an organic matter such as photoresist. This is because the oxygen plasma reacts at the normal temperature with carbon (C) and hydrogen (H) being the constituent elements of the organic matter on the member to be processed, turns into water ($H_2O$) and carbon dioxide ($CO_2$) and is gasified and removed. Fluorine (F) and a mixed gas consisting of fluorine and oxygen are effective for silicon (Si) as well as polycrystalline silicon (Si) and a passivation film, such as a silicon oxide ($SiO_2$) film and a silicon nitride ($Si_3N_4$) film. This is because the fluorine plasma reacts to produce a gasifying substance such as $SiF_4$, $SiOF_2$ and $SiOF_6$ and to be removed, and besides, $N_2$, $O_2$, etc., are generated by other constituent elements and are removed. However, when the fluorine gas is directly introduced, the vacuum exhausting system is heavily damaged in some cases, and hence, a freon ($CF_4$) gas is often used.

As to aluminum (Al) which is a metal often used, it is well known that aluminum chloride ($AlCl_3$) being a chloride has evaporability. In this connection the reaction does not proceed by the use of only the chlorine plasma, and it proceeds effectively when energy of several tens eV is given to the chlorine plasma by the probe of the apparatus. In this case, the chlorine gas sometimes damages the vacuum exhausting system, and hence, a chlorodaiflon ($CHClF_2$) gas containing chlorine or the like is used.

Other metals including tungsten (W), molybdenum (Mo), gold (Au), platinum (Pt), titanium (Ti), tantalum (Ta), etc., can also form evaporable compounds and be removed by the use of gases of appropriate mixing ratios between freon and oxygen. Also in this case, the reaction velocity is further enhanced by bestowing energy of several tens eV.

While, in the foregoing embodiments, the high frequency non-polar discharge or the magnetron is adopted for the plasma generation, it may be replaced with another plasma generating means, for example, a low voltage arc discharge employing a hot cathode or a PIG (Penning Ionization Gauge) type discharge. The plasma generating chamber and the plasma processing chamber may be constructed of a nonmagnetic substance other than quartz and stainless steel. Further, the semiconductor substrate may be situated in parallel with the plasma current.

As understood from the above description, in the plasma processor of this invention, the pressure in the plasma generating chamber is made to be suitable for the plasma generation, while the pressure in the plasma processing chamber is made lower than that of the plasma generating chamber so that the plasma may be transported in the ionized state by the coaxial magnetic fields, i.e., that the distance from the plasma generating chamber to the member to be processed (the semiconductor substrate) may be less than the length of the mean free path of the gas remaining in the plasma processing chamber, so that the member to be processed can be subjected to the plasma processing outside the plasma generating chamber.

As apparent from the embodiment shown in FIG. 3, the plasma generating chamber adjoins the plasma processing chamber in contrast to the structure disclosed in Japanese Patent Application No. 74182/1972 in which the plasma generating chamber exists within the plasma processing chamber. Thus, the plasma generating means, the cooling means, etc., can be arranged around the plasma generator more easily than in the prior art arrangement.

The plasma apparatuses described above transport the processing plasma to the semiconductor substrate of the member to be processed in the form of a plasma stream, as illustrated in FIGS. 2 and 3. Therefore, they have the advantages that control over the quantity and the property of the plasma to be transported is easy and that the period of time for the processing is short. Accordingly, when applied to a production process, the apparatuses bring forth very great effects. In order to further demonstrate the capability of mass processing, however, it becomes necessary that the semiconductor substrate of the member to be processed, which is located in the high vacuum, be capable of being inserted and taken out in a short time.

Figure 4:
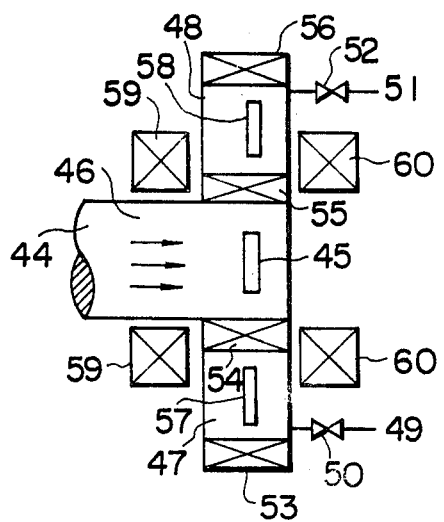
FIG. 4 is a schematic view showing essential portions in the plasma processor according to this invention.

FIG. 4 shows a structure for executing such insertion and taking out of the semiconductor substrate in a short time. Referring to the figure, numeral 44 designates the plasma processing chamber in FIG. 2 or FIG. 3, numeral 45 the semiconductor substrate of the member to be processed, and numeral 46 the plasma stream. Preliminary evacuation chambers 47 and 48 are provided on both sides of the processing chamber 44. The respective chambers have exhaust valves 50 and 52 and small-sized valves 49 and 51. The preliminary evacuation chambers are cut off from the atmospheric pressure and the processing chamber by valves 53-56.

In inserting the semiconductor substrate, the valve 53 is opened, the preliminary chamber 47 is placed at 1 atm., a semi-conductor substrate 57 is inserted, the valve 53 is shut, the preliminary evacuation chamber 47 is preliminarily evacuated by the exhaust valves 49 and 50, the valve 54 is opened after completion of the evacuation, the semiconductor substrate is moved to the substrate position 45, and the valve 54 is shut again. In discharging the semiconductor substrate after completion of the processing, the preliminary evacuation chamber 48 is evacuated by the exhaust valves 51 and 52, the valve 55 is subsequently opened, the semiconductor substrate is moved to a substrate position 58, the valve 55 is subsequently shut to place the preliminary evacuation chamber 48 at atmospheric pressure, the valve 56 is opened, and the semiconductor substrate is taken out. In this way, the insertion and taking-out of the substrate can be done without lowering the degree of vacuum of the plasma processing chamber. They can be controlled automatically in short time periods by the use of various moving mechanisms and detecting systems. In the figure, numerals 59 and 60 denote coaxial electromagnets, which serve to create a magnetic pipe for the plasma stream to the substrate 45.

Description will now be made of an aspect of performing deposition owing to the plasma stream by the processor.

The deposition technique for a semiconductor substrate includes the depositions of silicon and an impurity for the epitaxial crystal growth and the formation of a polycrystalline silicon film, the depositions of a silicon oxide ($SiO_2$) film, a silicon nitride ($Si_3N_4$) film, phosphorus silicate glass (PSG) and boron silicate glass (BSG) for the formations of passivation films, etc. There are also the depositions of films of various metals (Al, Pt, Au, Ti, Mo, W) for the formations of wirings and electrodes. Further, the deposition of an impurity for thermal diffusion is known.

The depositions are mainly carried out by the transportation in the vapor phase, the vacuum evaporation process, the CVD (Chemical Vapor Deposition) process, etc. Unlike these methods, the ion plating process, the plasma CVD process, etc., have recently been developed and are going to be put into practical use in some fields. Here will be explained a case of forming a nitride film by the plasma CVD process.

In order to form a nitride film on a semiconductor substrate by the prior art CVD process employing a high temperature, the semiconductor substrate is heated to about 800° C., mixed vapors of silicon tetrachloride ($SiCl_4$) and ammonia ($NH_3$) are fed onto the substrate, and they are caused to react on the substrate.

Figure 5:
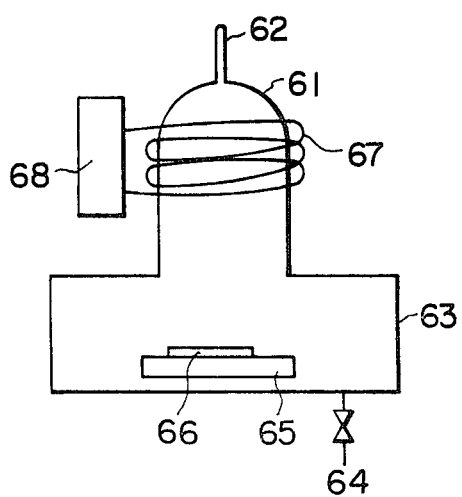
FIG. 5 is a diagrammatic view showing an aspect of the performance of the plasma CVD process.

On the other hand, a known plasma CVD process recently developed is performed in the manner illustrated in FIG. 5. Referring to the figure, numeral 61 designates an electric discharge portion of an outer wall of a quartz vessel in the plasma CVD process, and numeral 63 a reaction portion of the outer wall. While a mixed gas consisting of nitrogen ($N_2$) and monosilane gas ($SiH_4$) is being introduced into the vessel through a gas introducing port 62 and the vessel is being evacuated by an exhaust valve 64 mounted on the reaction portion, the internal pressure of the vessel is maintained at 1–3 Torr. Numeral 66 indicates a semiconductor substrate of a member to be processed, and numeral 65 a heating plate which heats the substrate to a certain temperature by means of a heater (not shown). Under this state, the reaction does not take place even when the semiconductor substrate is heated to several hundreds degrees centigrade by the heating plate 65. When a high frequency discharge is created by applying high frequency field to the portion 61 by means of a high frequency oscillation coil 67 connected to an oscillator 68, which are mounted on the discharge portion 61, nitrogen and monosilane of the introduced gas react on the substrate 66 at a substrate temperature of about 300° C., and a silicon nitride film is formed similar to that which is formed at 800° C. by the hitherto conventional CVD process employing a high temperature.

According to this method, the plasma density due to the discharge occurring in the discharge portion 61 is extremely low and is only to the extent of 12% Therefore, the amount of plasma in the mixed gas which gets onto the substrate 66 is extremely small. The mixed gas is merely in the state in which "the seed of plasma is intermixed" and is of the low ionization plasma in which the remainder is a gas of neutral particles. Even in such condition, the effect for the lowering of the reaction temperature is great. Accordingly, if the mixed reaction gas is a plasma of 100%, it is expected that the effect of further lowering the reaction temperature will arise. This is one feature of the application to a semiconductor, of the deposition process of the method of transporting a substance by a plasma current by employing a magnetic pipe.

Regarding the deposition by a plasma stream, the fundamental deposition process has been proposed under the title of "Method of transporting a substance by plasma" in the specification of Japanese Patent Application Publication 38801/1970 by the present applicant. Further, regarding a case of a plurality of plasma sources and plasma currents, Japanese Patent Application No. 34629/1971, "Apparatus for transporting substances by plasma currents", Japanese Patent Application No. 34630/1971, "Method of forming a thin film", Japanese Patent Application No. 34631/1971, "Method of growing a crystal", Japanese Patent Application No. 34632/1971, "impurity doping method", and Japanese Patent Application No. 74174/1972, "Method of manufacturing a semiconductor device" have been proposed by the present applicant.

As a result of many experiments for the performance of these methods, however, it has been revealed, as previously stated in the explanation of the etching of the invention of the present application, that where the degree of vacuum in the plasma processing chamber is inferior, plasma particles in the processing chamber recombine into neutral atoms, so that the efficiency of the plasma transportation lowers conspicuously, and besides, the residual gas reacts with the deposition substance or intermixes into the deposition film. The problems have been solved, basically, by the method of construction as explained with reference to FIG. 2. In this case, the gas which is introduced through the gas introducing pipe 13 in FIG. 2 is selected according to the purpose of the deposition substance. It is a gas containing the substance material at the normal temperature, for example, an element gas such as oxygen ($O_2$) nitrogen ($N_2$) and argon (Ar), and besides, a monosilane ($SiH_4$) gas for silicon (Si), a boron trifluoride ($BF_3$) gas for boron (B) or a phosphine ($PH_3$) gas for phosphorus. When a liquid which exhibits a high vapor pressure at the normal temperature is used, there is trimethyl antimony(($CH_3)_3Sb$) for antimony (Sb) or trimethyl gallium (($CH_3)_3Ga$) for gallium (Ga). Trimethyl aluminum (($CH_3)_3Al$) etc., are used for aluminum (Al). In case of a substance which is solid at the normal temperature and which forms neither a proper gas nor a compound of high vapor pressure, a solid sputtering mechanism (not shown in FIG. 3) is mounted and sputtered atoms are introduced, or alternatively, the substance is gasified by a heater (resistance heating) or by heating means such as an electron beam or a laser, and the vapor is introduced and turned into a plasma.

The substance thus turned into the plasma is transported as a plasma stream and is deposited onto the substrate 18, as shown in FIG. 2. The substrate is generally at the normal temperature, and, if necessary, it is heated to a necessary extent by a substrate heating mechanism (not shown).

It is stated in the specifications of the aforecited applications that, by applying an appropriate electric potential to the plasma as in the case of the aforecited etching, the properties of the deposited film, such as the crystal state thereof, can be controlled. Besides, by combining the potential to be applied to the plasma and the divergence or intensity of the magnetic field, the angle of incidence of the ions to be deposited onto the semiconductor can be adjusted. This brings forth, conjointly with the energy for the ions given to the plasma, the feature that where the deposition is done on the substrate having minute uneven parts on its surface, the extent of the adhering-round or turning-round (step coverage) of the deposition film into very small pores can be controlled.

Although an example of a specific construction of the deposition apparatus according to this invention is essentially the same as in the case of the etching processing illustrated in FIG. 3, the above-mentioned various plasma sources can be employed for the plasma generation. Besides, the kind of the substance to be supplied to the plasma source and the method of supply differ, and means for heating the substrate 40 in FIG. 3 is included under some processing conditions.

The deposition apparatus can be endowed with the capability of mass processing in such a way that the insertion and taking-out of the substrate are done in short times by the use of substrate exchanging means which has the preliminary evacuation chambers as in FIG. 4 as stated in the case of the etching processing.

In the above, description has been made of the plasma processings of semiconductor substrates. However, this invention is not restricted thereto, but it is also applicable to the processing of a glass substrate and the processings of high polymer resin substrate, a metal plate, etc.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A plasma processor comprising a plasma generating chamber having a plasma outflow port, means for introducing a gas into said plasma generating chamber, means for ionizing said gas in said plasma generating chamber to form a plasma, a plasma processing chamber disposed in communication with said plasma outflow port and which receives therein at a predetermined location a member to be processed, means for generating coaxial magnetic fields at least between said plasma outflow port and said member located in said plasma processing chamber for confining the plasma effused from said outflow port within a volume defined by said coaxial magnetic fields and for transporting said confined plasma from said plasma outflow port to said member to be processed in said plasma processing chamber, and means for evacuating said plasma processing chamber such that the distance between said plasma outflow port and said member to be processed in said plasma processing chamber is less than the length of the mean free path of any gas remaining in said plasma processing chamber.

2. The plasma processor according to claim 1, wherein said plasma generating chamber and said plasma processing chamber form adjacent chambers within a single envelope.

3. The plasma processor according to claim 1, wherein said magnetic field generating means includes means for generating a coaxial magnetic field in said plasma processing chamber which diverges in the vicinity of said member to be processed.

4. The plasma processor according to claim 1, further including probe means disposed at least in part in said plasma generating chamber for increasing the electric potential of said plasma.

5. The plasma processor according to claim 1, wherein said plasma generating chamber and said plasma processing chamber are interconnected by a plasma outflow pipe extending from said plasma outflow port.

6. The plasma processor according to claim 1, wherein said means for ionizing said gas includes a pair of electrodes disposed in said plasma generating chamber and a magnetron connected to said pair of electrodes, and further including electromagnetic field generating means disposed outside said plasma generating chamber for extending the orbit lengths of electrons which are accelerated by the high frequency electric field established between said pair of electrodes.

7. A plasma processor comprising a plasma generating chamber having a plasma outflow port, means for introducing a gas into said plasma generating chamber, means for ionizing said gas in said plasma generating chamber to form a plasma, a plasma processing chamber disposed in communication with said plasma outflow port and which receives therein at a predetermined location a member to be processed, means for generating coaxial magnetic fields at least between said plasma outflow port and said located member in said plasma processing chamber for confining the plasma effused from said outflow port within the coaxial magnetic fields and for transporting said confined plasma from said plasma outflow port to said member to be processed in said plasma processing chamber, means for evacuating said plasma processing chamber such that the distance between said plasma outflow port and said member to be processed in said plasma processing chamber is less than the length of the mean free path of any gas remaining in said plasma processing chamber, and at least one preliminary evacuation chamber connected to said plasma processing chamber by means of a sealable opening to permit exchange of said member to be processed in said processing chamber without significantly lowering the degree of vacuum in said processing chamber.

8. The plasma processor according to claim 7, wherein said magnetic field generating means includes means for generating a coaxial magnetic field in said plasma processing chamber which diverges in the vicinity of said member to be processed.

9. The plasma processor according to claim 8, wherein said means for ionizing said gas includes a pair of electrodes disposed in said plasma generating chamber and a magnetron connected to said pair of electrodes, and further including electromagnetic field generating means disposed outside said plasma generating chamber for extending the orbit lengths of electrons which are accelerated by the high frequency electric field established between said pair of electrodes.

10. The plasma processor according to claim 9, further including probe means disposed at least in part in said plasma generating chamber for increasing the electric potential of said plasma.

11. A plasma processor comprising a plasma generating chamber having a plasma outflow port, means for introducing a gas into said plasma generating chamber, means for ionizing said gas in said plasma generating chamber to form a plasma, a plasma processing chamber disposed in communication with said plasma outflow port and which receives therein at a predetermined location a member to be processed, means for evacuating said plasma processing chamber so as to make the pressure in said plasma processing chamber lower than that of said plasma generating chamber and means for generating coaxial magnetic fields at least between said plasma outflow port and said located member in said plasma processing chamber for confining the plasma effused from said outflow port within a volume defined by said coaxial magnetic fields and for transporting said plasma from said plasma outflow port to said member to be processed.

12. The plasma processor according to claim 11, wherein said plasma generating chamber and said plasma processing chamber form adjacent chambers within a single envelope.

13. The plasma processor according to claim 11, further including probe means disposed at least in part of said plasma generating chamber for increasing the electric potential of said plasma.

14. The plasma processor according to claim 11, wherein said plasma generating chamber and said plasma processing chamber are interconnected by a plasma outflow pipe extending from said plasma outflow port.

15. The plasma processing according to claim 11, wherein said means for ionizing said gas includes a pair of electrodes disposed in said plasma generating chamber and a magnetron connected to said pair of electrodes, and further including electromagnetic field generating means disposed outside said plasma generating chamber for extending the orbit lengths of electrons which are accelerated by the high frequency electronic field established between said pair of electrodes.

16. In a method for transporting plasma onto a major surface of a member to be processed in a plasma processing chamber disposed in communication with a plasma generating chamber for generating said plasma, the improvement which comprises transporting said plasma through a magnetic field pipe extending from said plasma generating chamber to said member in said plasma processing chamber, while evacuating the remaining gas surrounding said magnetic field pipe in said plasma processing chamber so that the pressure in said plasma processing chamber is reduced in relation to said generating chamber so that the length of the mean free path of any gas which remains in said plasma processing chamber is more than a distance from the plasma generating chamber to said member to be processed.

17. The improvement of claim 16 wherein said member to be processed is a semiconductor substrate.

18. In a method for transporting a plasma onto a major surface of a member to be processed in a plasma processing chamber disposed in communication with a plasma generating chamber for generating a plasma, the improvement which comprises transporting said plasma through a magnetic field pipe extending from said plasma generating chamber to said member in said plasma processing chamber, while evacuating the remaining gas surrounding said magnetic field pipe in said plasma processing chamber so that the pressure in the plasma processing chamber is lower than that of the plasma generating chamber so that the length of the mean free path of any gas which remains in said plasma processing chamber is more than a distance from the plasma generating chamber to said member to be processed.

19. The improvement of claim 18 wherein said member to be processed is a semiconductor substrate.

20. A method for treating a semiconductor substrate by transporting a plasma thereto comprising the steps of:
generating a plasma in a first chamber, said first chamber having a plasma outflow opening,
effusing the plasma in a predetermined direction from said plasma outflow opening into a second chamber,
disposing said semiconductor substrate across said predetermined direction in said second chamber, opposed to said plasma outflow opening and apart therefrom with the distance being less than the length of the mean free path of any gas which resides in said second chamber and transporting said effused plasma from said plasma outflow opening to said disposed semiconductor substrate through a magnetic field pipe extending in said second chamber from said plasma outflow opening to said disposed semiconductor substrate while evacuating the remaining gas surrounding said magnetic field pipe, thereby subjecting said semiconductor substrate to the effused plasma from said plasma outflow opening in said second chamber so as to treat said semiconductor substrate.

21. In a method for transporting a plasma onto a major surface of a member to be processed in a plasma processing chamber disposed in communication with a plasma generating chamber for generating a plasma, the improvement which comprises transporting said plasma from said plasma generating chamber to said member through a magnetic field pipe formed in said plasma processing chamber, while evacuating the remaining gas surrounding said magnetic field pipe in said plasma processing chamber so that the pressure in the plasma processing chamber is lower than that of the plasma generating chamber.

22. A plasma processor comprising a plasma generating chamber having a plasma outflow port, means for introducing a gas into said plasma generating chamber, means for ionizing said gas in said plasma generating chamber to form a plasma, a plasma processing chamber disposed in communication with said plasma outflow port and which receives therein at a predetermined location a member to be processed, means for generating a magnetic field pipe extending in said plasma processing chamber from said outflow port to said member located in said plasma processing chamber to confine the effused plasma flowing from said outflow port into said plasma processing chamber to a desired volume, and means for evacuating said plasma processing chamber so as to make the pressure in said plasma processing chamber lower than that of said plasma generating chamber, thereby providing a long means free path for the plasma in said plasma processing chamber.

23. A plasma processor comprising:
   a plasma generating chamber having a plasma outflow port,
   means for introducing a gas into said plasma generating chamber,
   means for ionizing said gas in said plasma generating chamber to form a plasma,
   a plasma processing chamber disposed in communication with said plasma outflow port and which receives therein at a predetermined location a member to be processed,
   means for generating a magnetic field pipe extending in said plasma processing chamber from said plasma outflow port of the plasma generating chamber to said member to be processed in said plasma processing chamber to confine in the magnetic field pipe the plasma effused from said plasma outflow port into said plasma processing chamber, and
   means for at least partially evacuating said plasma processing chamber through an exhaust port in said plasma processing chamber disposed outside said magnetic field pipe to permit exhaustion of the remaining gas surrounding said magnetic field pipe is said plasma processing chamber in order to obtain a long mean free path for the plasma in said plasma processing chamber.

24. The plasma processor according to claim 23, further comprising means for applying an electric potential to said plasma confined in said magnetic field pipe.

25. The plasma processor according to claim 24, wherein said electric potential is effective to promote the chemical reaction between said plasma and said member to be processed.

26. The plasma processor according to claim 25, wherein said electric potential is lower than about 10 volts.

27. A plasma processor comprising:
   a plasma generating chamber for generating a plasma including means for introducing a gas to be ionized to form said plasma therefrom, said plasma generating chamber having a plasma outflow opening for effusing said plasma;
   a plasma processing chamber disposed in communication with said plasma outflow opening and which receives therein at a predetermined location a member to be processed;
   means for generating a magnetic field pipe extending in said plasma processing chamber from said plasma outflow opening to said member to be processed in said plasma processing chamber to thereby confine the plasma effused from said plasma outflow opening into said plasma processing chamber;
   means for at least partially evacuating said plasma processing chamber through an exhaust opening disposed in said plasma processing chamber outside said magnetic field pipe to permit exhaustion of the remaining gas surrounding said magnetic field pipe in said plasma processing chamber so as to obtain a long mean free path for the plasma in said plasma processing chamber, said means for evacuating being cooperative with said means for introducing so as to make the pressure in said plasma processing chamber lower than that of said plasma generating chamber; and
   means for applying an electric potential to said plasma confined in said magnetic field pipe so as to convert said confined plasma in said magnetic field pipe into ions at said member to be processed in said plasma processing chamber.

* * * * *